United States Patent
Lin

(10) Patent No.: US 9,659,654 B2
(45) Date of Patent: May 23, 2017

(54) METHOD TO PREVENT LOSS OF DATA OF A TRANSISTOR-BASED MEMORY UNIT

(71) Applicant: eGalax_eMPIA Technology Inc., Taipei (TW)

(72) Inventor: Guang-Huei Lin, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 0 days.

(21) Appl. No.: 15/279,970

(22) Filed: Sep. 29, 2016

(65) Prior Publication Data

US 2017/0092360 A1    Mar. 30, 2017

Related U.S. Application Data

(60) Provisional application No. 62/234,887, filed on Sep. 30, 2015.

(51) Int. Cl.

| | |
|---|---|
| *G11C 16/06* | (2006.01) |
| *G11C 16/04* | (2006.01) |
| *G11C 16/10* | (2006.01) |
| *G11C 16/14* | (2006.01) |
| *H01L 29/788* | (2006.01) |

(52) U.S. Cl.
CPC .......... *G11C 16/0408* (2013.01); *G11C 16/10* (2013.01); *G11C 16/14* (2013.01); *H01L 29/7883* (2013.01)

(58) Field of Classification Search
CPC ..... G11C 16/0425; G11C 16/14; G11C 16/16; G11C 13/0004; G11C 13/0059; G11C 16/22; G11C 16/26; G11C 16/3418; G11C 16/3431; G11C 7/24; G11C 13/004; G11C 13/0097; G11C 14/0063; G11C 16/0416; G11C 16/0466; G11C 16/08

USPC ............ 365/185.29, 185.02, 185.08, 185.18, 365/185.22, 185.26, 185.3, 200, 222; 257/E21.422, E27.103, 316, 317, 257/E23.081, 315, 318, 319

See application file for complete search history.

(56) References Cited

U.S. PATENT DOCUMENTS

2007/0018231 A1 *  1/2007  Mitani .............. H01L 21/28273
                                                              257/315

* cited by examiner

*Primary Examiner* — Thong Q Le
(74) *Attorney, Agent, or Firm* — Muncy, Geissler, Olds & Lowe, P.C.

(57) ABSTRACT

A method to prevent loss of data of transistor-based memory unit including bulk, source and drain formed on bulk and first tunnel oxide, floating gate, second tunnel oxide and control gate stacked up on channel between source and drain is disclosed to include steps of: erasing the floating gate, using weak electric field inject small amount of electrons into floating gate, enabling small amount of electrons to remain in floating gate to keep channel between source and drain electrically conducted, enabling small amount of electrons in floating gate to repel against electrons in first tunnel oxide and second tunnel oxide so as avoid electron accumulation in first tunnel oxide and second tunnel oxide and allow normal data access floating gate, and using electric field of normal write to inject electrons in floating gate so as to prevent channel conduction between source and drain and allow writing data into floating gate.

4 Claims, 2 Drawing Sheets

METHOD TO PREVENT LOSS OF DATA OF A TRANSISTOR-BASED MEMORY UNIT

This reference is based on Provisional Application Ser. No. 62/234,887, filed on Sep. 30, 2015, currently pending.

BACKGROUND OF THE INVENTION

1. Field of the Invention

The present invention relates to a touch-sensing input device and more particularly, to a method to prevent loss of data of a transistor-based memory unit is achieved by: erasing the floating gate (FG) and injecting a small amount of electrons into the floating gate (FG) to avoid electron accumulation in the first tunnel oxide (TO) and the second tunnel oxide (TO) and to allow normal data access to the floating gate (FG), and then using an electric field of a normal write to inject electrons in the floating gate (FG) to prevent channel conduction between the source (S) and the drain (D) and to allow writing data into the floating gate (FG), thereby reducing the possibility of a read error.

2. Description of the Related Art

A memory is a semiconductor component for storing electronic information or data, etc. Semiconductor memory devices made by using a semiconductor manufacturing process can be classified into non-volatile semiconductor devices (such as flash memory device) and volatile semiconductor devices [such as dynamic random access memory (DRAM), static random access memory device (SRAM), etc.]. A flash memory is a non-volatile semiconductor memory that does not require power to retain data and, that can be electrically erased and reprogrammed. For the advantages stated, flash memory devices are widely used in mobile electronic devices, such as tablet computers, smart phones, digital cameras, PDAs, or other mobile game devices.

A flash memory erases data in units called blocks. Every memory block comprises a plurality of memory cells. A basic flash memory cell consists of a storage transistor with a control gate (CG), a floating gate (FG), a source (S) and a drain (D). The memory cell information is based on the amount of electrons stored in the floating gate (FG). Normally, an erase operation is performed before a write operation, i.e. before electrons are injected into the floating gate (FG). When the floating gate (FG) has sufficient electrons, an electric field effect is created in the floating gate (FG) to prevent the formation of the D-S channel between the source (S) and the drain (D). When the flash memory is read, only a small current (leakage current) or no current is measured, representing state "0" or a logic "0". When the floating gate (FG) does not have enough electrons to prevent the formation of the D-S channel between the source (S) and the drain (D), the D-S channel between the source (S) and the drain (D) conducts. Thus, when the flash memory is read, a large enough current (VGS>Vth) is measured, representing state "1" or a logic "1".

If defects occur in the manufacturing process, hot electrons may get stuck in the tunnel oxide (TO) between the floating gate (FG) and the control gate (CG) over time, and the electrons will continue to accumulate in the tunnel oxide (TO), such that when the flash memory is read, the D-S channel between the drain (D) and the source (S) may not be formed. Even when the floating gate (FG) does not have enough electrons to prevent the formation of the D-S channel between the drain (D) and the source (S), which should result in state "1" or a logic "1", the electrons accumulated in the tunnel oxide (TO) would cause an incorrect state "0" or a logic "0" to be read as a result. Thus, when writing new memory cell information into the floating gate (FG), it will be overlapped on the original memory cell information, resulting in loss of memory data.

Therefore, it is desirable to provide a method to overcome the aforementioned problem of loss of data of the floating gate due to accumulation of electrons in the tunnel oxide layer.

SUMMARY OF THE INVENTION

The present invention has been accomplished under the circumstances in view. It is therefore the main object of the present invention to provide a method to prevent loss of data of a transistor-based memory unit, which prevents data loss and reduces the possibility of a read error.

To achieve this and other objects of the present invention, a method to prevent loss of data is used a transistor-based memory unit, which comprises a bulk, a source (S) and a drain (D) formed on the bulk, a channel in communication between the source (S) and the drain (D), and a first tunnel oxide (TO), a floating gate (FG), a second tunnel oxide (TO) and a control gate (CG) stacked up on the channel in a proper order in such a manner that the first tunnel oxide (TO) is formed between the bulk and one side of the floating gate (FG) and the second tunnel oxide (TO) is formed between an opposite side of the floating gate (FG) and the control gate (CG). The method to prevent loss of data in the memory unit comprises the step of erasing the floating gate (FG), the step of using a weak electric field lower than normal writing to inject a small amount of electrons into the floating gate (FG), the step of enabling the small amount of electrons to remain in the floating gate (FG) so as to keep the channel between the source (S) and the drain (D) of the transistor electrically conducted, the step of enabling the small amount of electrons in the floating gate (FG) to repel against electrons in the first tunnel oxide (TO) and the second tunnel oxide (TO) so as to avoid electron accumulation in the first tunnel oxide (TO) and the second tunnel oxide (TO) and to allow normal data access to the floating gate (FG), and the step of using an electric field of a normal write to inject electrons in the floating gate (FG) to prevent channel conduction between the source (S) and drain (D) of the transistor and to allow writing data into the floating gate (FG), prohibiting overlaps of data and preventing data loss.

Preferably, the step of erasing the floating gate (FG) is achieved by applying a voltage of 9~12V to the control gate (CG) and a voltage of 6V to the source (S) to make the floating gate (FG) represent the state "1". When the FG does not have enough electrons to prevent the formation of the channel between the source (S) and the drain (D), the D-S channel conducts.

Preferably, the step of using an electric field of a normal write to inject electrons in the floating gate (FG) is achieved by applying a voltage of 12V to the control gate (CG) and a voltage of 7V to the drain (D) to make the floating gate (FG) represent the state "0", preventing the formation of the channel between the source (S) and the drain (D).

Preferably, electrons are injected into the floating gate (FG) using "Channel Hot Electron (CHE)" injection or Fowler-Nordheim (FN) tunneling mechanism.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
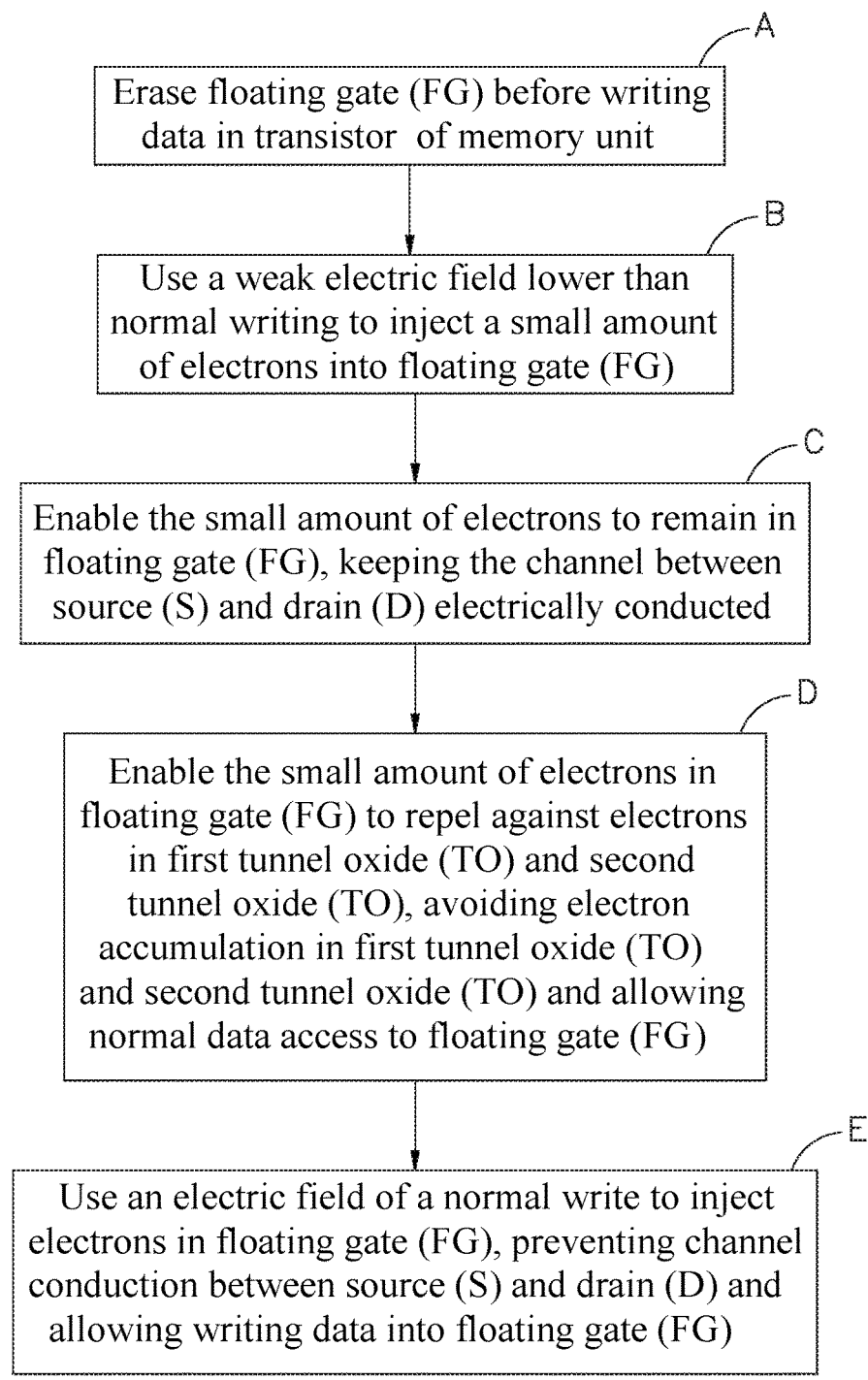
FIG. 1 is a flow chart of the present invention.
Figure 2:
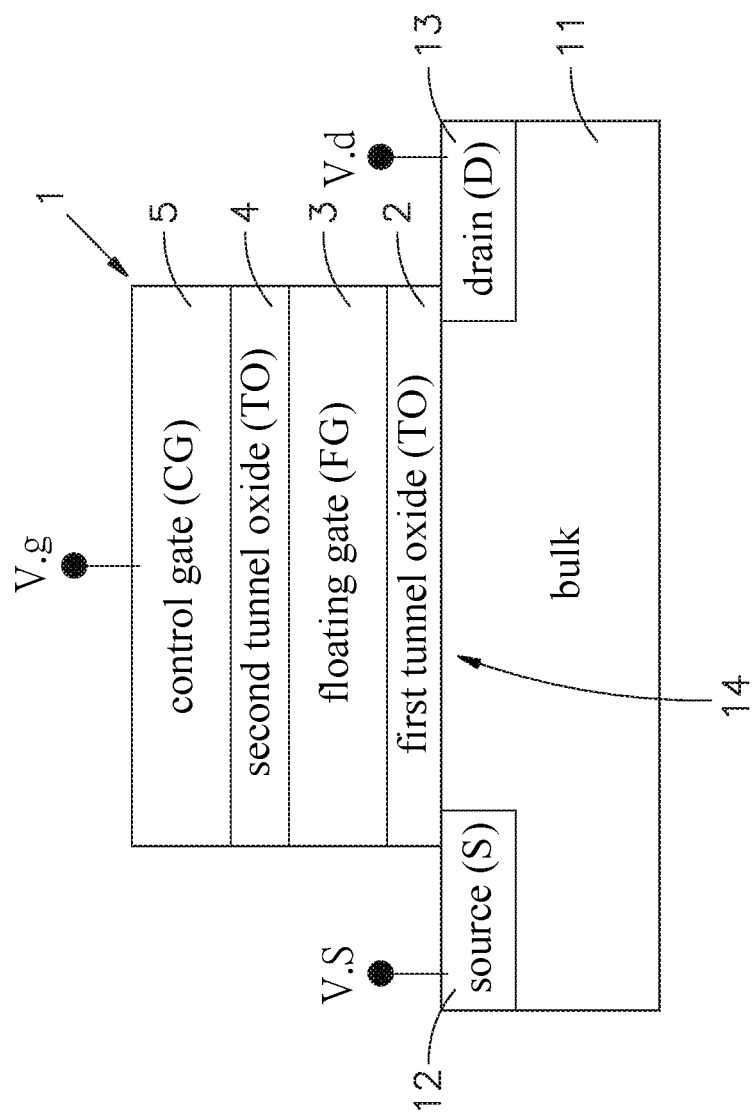
FIG. 2 is a sectional side view illustrating the structure of a memory unit in accordance with the present invention.

Referring to FIGS. 1 and 2, a flow chart of the present invention and a sectional side view illustrating the structure of a memory unit in accordance with the present invention are shown. As illustrated in the best mode of the present invention, a transistor 1 of the memory unit (for example, flash memory) comprises a bulk 11, a source (S) 12 and a drain (D) 13 formed on the bulk 11, a channel 14 in communication between the source (S) 12 and the drain (D) 13, and a first tunnel oxide (TO) 2, a floating gate (FG) 3, a second tunnel oxide (TO) 4 and a control gate (CG) 5 stacked up on the channel 14 in a proper order in such a manner that the first tunnel oxide (TO) 2 is formed between the bulk 11 and one side of the floating gate (FG) 3; the second tunnel oxide (TO) 4 is formed between an opposite side of the floating gate (FG) 3 and the control gate (CG) 5. The method to prevent loss of data in the memory unit comprises the steps of:

(A) Erase the floating gate (FG) 3 before writing the data to be stored in the transistor 1 of the memory unit.

(B) Use a weak electric field lower than normal writing to inject a small amount of electrons into the floating gate (FG) 3.

(C) Enable the small amount of electrons to remain in the floating gate (FG) 3, keeping the channel 14 between the source (S) 12 and drain (D) 13 of the transistor 1 electrically conducted.

(D) Enable the small amount of electrons in the floating gate (FG) 3 to repel against electrons in the first tunnel oxide (TO) and the second tunnel oxide (TO) 4, avoiding electron accumulation in the first tunnel oxide (TO) 2 and the second tunnel oxide (TO) 4 and allowing normal data access to the floating gate (FG) 3.

(E) Use an electric field of a normal write to inject electrons in the floating gate (FG) 3, preventing channel conduction between the source (S) 12 and drain (D) 13 of the transistor 1 and allowing writing data into the floating gate (FG) 3.

In the aforesaid step (A), erasing the floating gate (FG) 3 is achieved by applying a voltage of 9~12V or other available voltage equivalent to the control gate (CG) 5 and a voltage of 6V or other available voltage equivalent to the source (S) 12 to make the floating gate (FG) 3 represent the state "1". Thus, memory cells of electronic information or data can then be written into the floating gate (FG) 3 of the transistor 1. Further, in the aforesaid step (E), the programming operation of using an electric field of a normal write to inject electrons in the floating gate (FG) 3 is achieved by applying a voltage of 12V or other available voltage equivalent to the control gate (CG) 5 and a voltage of 7V or other available voltage equivalent to the drain (D) 13 to make the floating gate (FG) 3 of the transistor 1 represent the state "0". i.e., memory cells of electronic information or data have been written into the floating gate (FG) 3 of the transistor 1, reducing the possibility of a read error.

Further, in the aforesaid step (B) and (E), electrons are injected into the floating gate (FG) 3 using "Channel Hot Electron (CHE)" injection or Fowler-Nordheim (FN) tunneling mechanism.

Further, when reading the state ("1" or "0") of the transistor 1 of the flash memory, a current ($V_d$) flowing through the drain (D) 13 is measured. When a large enough current ($V_d > V_{th}$) flowing through the drain (D) 13 is measured, the D-S channel 14 between the drain (D) 13 and the source (S) 12 is formed. Measurement of a current ($V_d$) flowing through the drain (D) 13 can be achieved by connecting an external loop to the drain (D) 13. This measuring method is well known to those with ordinary skills in the art, and thus will not be further illustrated.

As stated above, the method of the present invention is used in a transistor-based memory unit. The transistor 1 of the memory unit comprises a bulk 11, a source (S) 12 and a drain (D) 13 formed on the bulk 11, a channel 14 in communication between the source (S) 12 and the drain (D) 13, and a first tunnel oxide (TO) 2, a floating gate (FG) 3, a second tunnel oxide (TO) 4 and a control gate (CG) 5 stacked up on the channel 14 in a proper order in such a manner that the first tunnel oxide (TO) 2 is formed between the bulk 11 and one side of the floating gate (FG) 3; the second tunnel oxide (TO) 4 is formed between an opposite side of the floating gate (FG) 3 and the control gate (CG) 5. The method is performed by erasing the floating gate (FG) 3. After electrons are erased, the state is "1". Thereafter, a weak electric field is used to inject a small amount of electrons into the floating gate (FG) 3. The small amount of electrons in the floating gate (FG) 3 repels against electrons in the first tunnel oxide (TO) 2 and the second tunnel oxide (TO) 4. Thereafter, an electric field of a normal write is used to inject electrons in the floating gate (FG) 3, preventing channel conduction between the source (S) 12 and the drain (D) 13 and allowing writing data into the floating gate (FG) 3. After the write operation, the state is "0". The few electrons injected into the floating gate (FG) 3 repel the electrons in the tunnel oxide layer, so electrons are less likely to accumulate in the tunnel oxide layer and are not sufficient to prevent the formation of the D-S channel 14, thus reducing the possibility of a read error.

In conclusion, the invention provides a method to prevent loss of data of a transistor-based memory unit including a bulk, a source (S) and a drain (D) formed on the bulk and a first tunnel oxide (TO), a floating gate (FG), a second tunnel oxide (TO) and a control gate (CG) stacked up on a channel between the source (S) and the drain (D). The method includes the step of erasing the floating gate (FG), the step of using a weak electric field to inject a small amount of electrons into the floating gate (FG), the step of enabling a small amount of electrons to remain in the floating gate (FG) to keep the channel between the source (S) and the drain (D) electrically conducted, the step of enabling the small amount of electrons in the floating gate (FG) to repel against electrons in the first tunnel oxide (TO) and the second tunnel oxide (TO) so as to avoid electron accumulation in the first tunnel oxide (TO) and the second tunnel oxide (TO) and to allow normal data access to the floating gate (FG), and the step of using an electric field of a normal write to inject electrons in the floating gate (FG) so as to prevent channel conduction between the source (S) and the drain (D) and to allow writing data into the floating gate (FG).

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A method to prevent loss of data of a transistor-based memory unit, which comprises a bulk, a source (S) and a drain (D) formed on said bulk, a channel in communication between said source (S) and said drain (D), and a first tunnel oxide (TO), a floating gate (FG), a second tunnel oxide (TO) and a control gate (CG) stacked up on said channel in a proper order in such a manner that said first tunnel oxide (TO) is formed between said bulk and one side of said floating gate (FG) and said second tunnel oxide (TO) is formed between an opposite side of said floating gate (FG) and said control gate (CG), the method to prevent loss of data in said memory unit comprising the steps of:
 (i) erasing said floating gate (FG);
 (ii) using a weak electric field lower than normal writing to inject a small amount of electrons into said floating gate (FG);
 (iii) enabling the said small amount of electrons to remain in said floating gate (FG) so as to keep said channel between said source (S) and said drain (D) of said transistor electrically conducted;
 (iv) enabling the said small amount of electrons in said floating gate (FG) to repel against electrons in said first tunnel oxide (TO) and said second tunnel oxide (TO) so as to avoid electron accumulation in said first tunnel oxide (TO) and said second tunnel oxide (TO) and to allow normal data access to said floating gate (FG);
 (v) using an electric field of a normal write to inject electrons in said floating gate (FG) to prevent channel conduction between said source (S) and said drain (D) of said transistor and to allow writing data into said floating gate (FG).

2. The method to prevent loss of data of a transistor-based memory unit as claimed in claim 1, wherein in step (i) of erasing said floating gate (FG) is achieved by applying a voltage of 9~12V to said control gate (CG) and a voltage of 6V to said source (S) to make said floating gate (FG) represent the state "1".

3. The method to prevent loss of data of a transistor-based memory unit as claimed in claim 1, wherein in step (ii) and step (v), electrons are injected into said floating gate (FG) using "Channel Hot Electron (CHE)" injection or Fowler-Nordheim (FN) tunneling mechanism.

4. The method to prevent loss of data of a transistor-based memory unit as claimed in claim 1, wherein in step (v) of using an electric field of a normal write to inject electrons in said floating gate (FG) is achieved by applying a voltage of 12V to said control gate (CG) and a voltage of 7V to said drain (D) to make said floating gate (FG) represent the state "0".

* * * * *